(12) United States Patent
Yang et al.

(10) Patent No.: US 8,466,504 B2
(45) Date of Patent: Jun. 18, 2013

(54) DRAM WITH DOPANT STOP LAYER AND METHOD OF FABRICATING THE SAME

(75) Inventors: Chia-Ming Yang, Kaohsiung (TW);
Yao-Hsien Wang, New Taipei (TW);
Chen-Kang Wei, Kaohsiung (TW);
Chien-Chi Lee, Taipei (TW); Ming Yean, Taoyuan County (TW); Yi-Wei Chuang, Taipei (TW); Hsiao-Lung Chiang, Taoyuan County (TW);
Hung-Chang Liao, Taipei (TW);
Chung-Yuan Lee, Tao-Yuan (TW);
Ming-Chi Chao, New Taipei (TW)

(73) Assignee: Inotera Memories, Inc., Hwa-Ya Technology Park Kueishan, Taoyuan (TW)

( * ) Notice: Subject to any disclaimer, the term of this patent is extended or adjusted under 35 U.S.C. 154(b) by 132 days.

(21) Appl. No.: 13/231,968

(22) Filed: Sep. 14, 2011

(65) Prior Publication Data

US 2012/0280297 A1   Nov. 8, 2012

(30) Foreign Application Priority Data

May 6, 2011   (TW) .............................. 100116025 A (51) Int. Cl.
*H01L 29/94*   (2006.01)
*H01L 31/119*   (2006.01)

(52) U.S. Cl.
USPC ................... 257/296; 257/330; 257/E27.084; 257/E21.646

(58) Field of Classification Search
None
See application file for complete search history.

(56) References Cited

U.S. PATENT DOCUMENTS

| 6,943,407 B2 | 9/2005 | Ouyang |
| 7,666,771 B2 | 2/2010 | Krull |
| 2005/0133836 A1* | 6/2005 | Seo et al. ....................... 257/288 |

* cited by examiner

*Primary Examiner* — Thien F Tran
(74) *Attorney, Agent, or Firm* — Winston Hsu; Scott Margo (57) ABSTRACT

A DRAM with dopant stop layer includes a substrate, a trench-type transistor and a capacitor electrically connected to the trench-type transistor. The trench-type transistor includes a gate structure embedded in the substrate. A source doping region and a drain doping region are disposed in the substrate at two sides of the gate structure. A boron doping region is disposed under the source doping region. A dopant stop layer is disposed within the boron doping region or below the boron doping region. The dopant stop layer includes a dopant selected from the group consisting of C, Si, Ge, Sn, Cl, F and Br.

2 Claims, 9 Drawing Sheets

DRAM WITH DOPANT STOP LAYER AND METHOD OF FABRICATING THE SAME

BACKGROUND OF THE INVENTION

1. Field of the Invention

The present invention generally relates to a DRAM with a dopant stop layer and a method of fabricating the DRAM with the dopant stop layer. In particular, the present invention is directed to a DRAM of longer data retention time and a method of fabricating the DRAM of longer data retention time.

2. Description of the Prior Art

A dynamic random access memory (DRAM) is an integrated circuit composed of many memory units. The DRAM is also one of the most popular main volatile memories used in modern computing devices. Each memory unit in the DRAM is composed of a metal oxide semiconductor (MOS) in series with a capacitor (also known as a single bit) or two capacitors (also known as double bits), wherein each MOS transistor and capacitor are electrically connected to several word lines and bit lines to further locate the address of each memory unit.

Longer data retention time is always a challenge for high quality DRAMs. With continuous shrinkage of component dimensions and improvement in processing speeds, it is becoming more and more difficult to keep data retention time at adequate levels. Accordingly, data retention time requires constant improvement.

Traditionally, boron dopant is used to adjust a threshold voltage of the MOS transistor in a DRAM process. Because boron dopant is susceptible to diffuse and form boron clusters in the presence of heat, however, electric leakage may be an unwanted consequence. The current solution to reduce boron clusters is to lower the concentration of the boron dopant used or to employ a lower temperature for the rapid thermal annealing, but these solutions respectively lead to a lower transistor threshold voltage or an NMOS electric problem.

SUMMARY OF THE INVENTION

In view of this, the present invention proposes a DRAM with a dopant stop layer. The DRAM includes a substrate and a trench-type transistor disposed on the substrate. The trench-type transistor includes a gate structure embedded in the substrate, a source doping region disposed in the substrate at one side of the gate structure, a drain doping region disposed in the substrate at another side of the gate structure, at least one boron doping region disposed in the substrate directly under the source doping region, a capacitor electrically connected to the drain doping region, and a dopant stop layer disposed within the boron doping region that overlaps with the boron doping region. The dopant stop layer includes a dopant which is selected from the group consisting of C, Si, Ge, Sn, Cl, F and Br.

The present invention also proposes a method for forming a DRAM with a dopant stop layer. First, a substrate which includes a gate structure embedded in the substrate, a source lightly doping region disposed in the substrate and at a first side of the gate structure and a drain lightly doping region disposed in the substrate and at a second side of the gate structure are provided. Then, a dopant stop layer is formed that is disposed in the substrate directly under the source doping region. The dopant stop layer includes a dopant which is selected from the group consisting of C, Si, Ge, Sn, Cl, F and Br. Next, a boron doping region is disposed in the substrate and partially overlaps with the dopant stop layer. A source doping region and a drain doping region are formed and respectively overlap with the source lightly doping region and the drain lightly doping region. A capacitor is then formed which is electrically connected to the drain doping region.

The present invention utilizes the dopant in the dopant stop layer to fill up the gap in the substrate lattice so as to avoid the diffusion of the boron dopant in the boron doping region during a thermal procedure and also to extend the data retention time of the DRAM products.

These and other objectives of the present invention will no doubt become obvious to those of ordinary skill in the art after reading the following detailed description of the preferred embodiment that is illustrated in the various figures and drawings.

DETAILED DESCRIPTION

FIGS. 1 to 6 illustrate a preferred embodiment of a process of the method for fabricating a DRAM with a dopant stop layer according to the present invention. First, a substrate 10 which includes a gate structure 12 is provided. The gate structure 12 may be a trench-type gate structure, a horizontal gate structure, or a fin-type gate structure. In this embodiment, the gate structure 12 is illustrated as a trench-type gate structure. In addition, the gate structure 12 may be composed of a gate conductor 14 and a gate dielectric layer 16.

Figure 1:
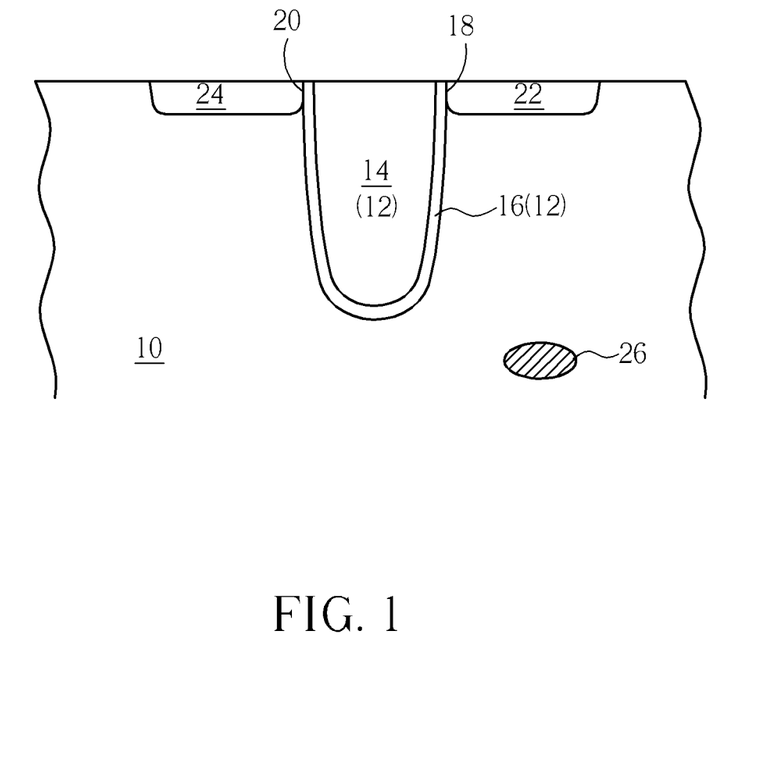
FIGS. 1 to 6 illustrate a preferred embodiment of a process of the method for fabricating a DRAM with a dopant stop layer according to the present invention.

A source lightly doping region 22 and a drain lightly doping region 24 are respectively formed in the substrate 10 at a first side 18 of the gate structure 12 and at a second side 20 of the gate structure 12. Dopant is then implanted directly under the source lightly doping region 22 to form a dopant stop layer 26 by ion implantation. The dopant may be C, Si, Ge, Sn, Cl, F or Br. Preferably, the dopant in the dopant stop layer 26 may be carbon by ion implantation such as vertical implantation or tilt implantation.

Figure 2:
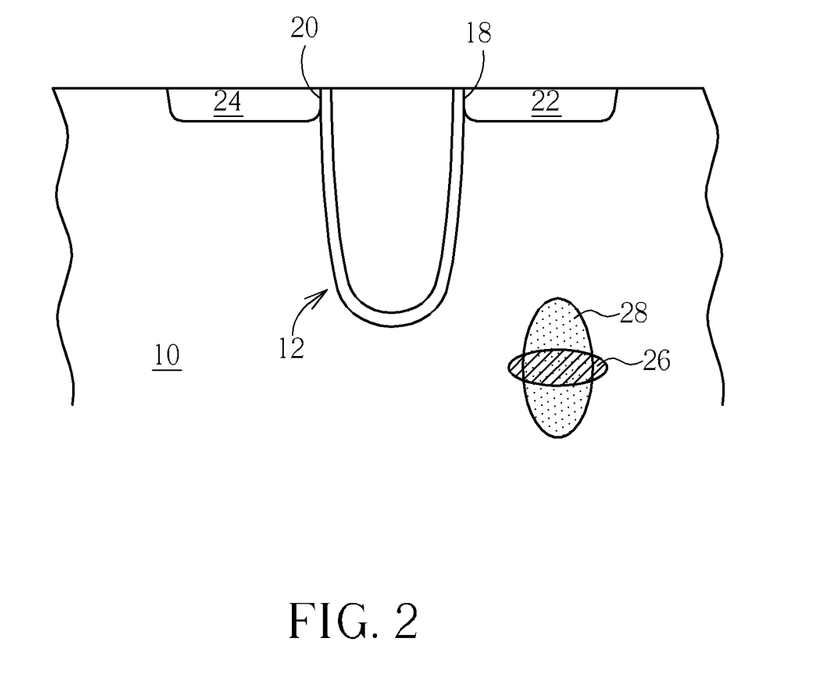
Figure 3:
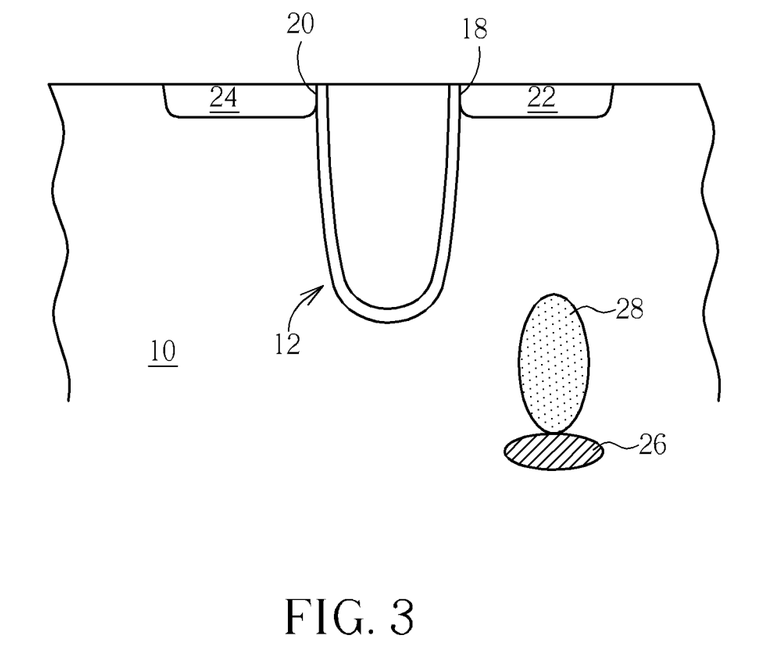

As shown in FIG. 2, another ion implantation is carried out to implant boron dopant directly under the source lightly doping region 22 to form at least a boron dopant region 28. The dopant stop layer 26 may be disposed within the boron dopant region 28 and the dopant stop layer 26 may partially overlap with the boron dopant region 28. Otherwise, as shown in FIG. 3, the dopant stop layer 26 may be disposed under the boron dopant region 28 and the dopant stop layer 26 may be selectively in contact with the boron dopant region 28.

Figure 4:
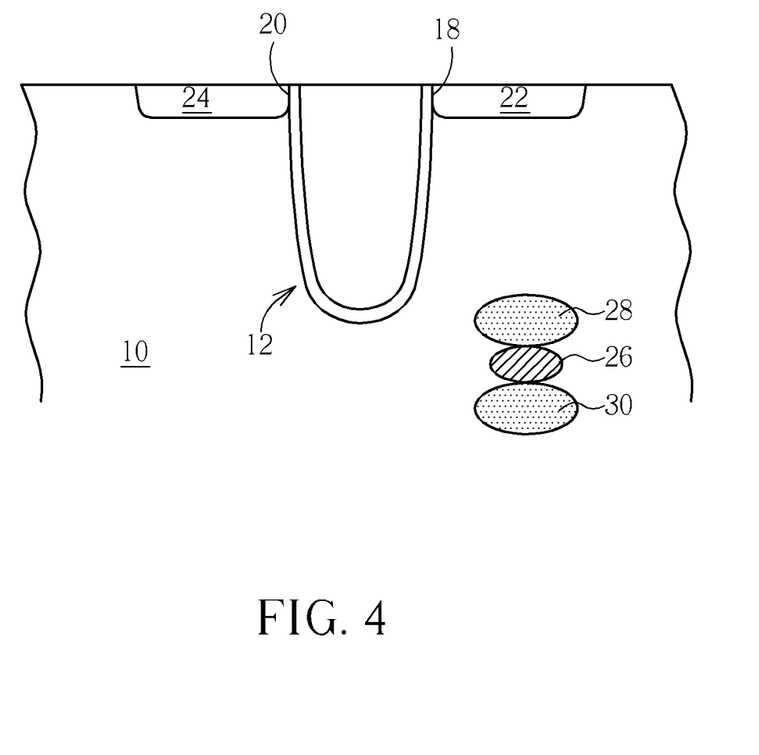

In accordance with another preferred embodiment, the ion implantation may form multiple boron dopant regions. For example, as shown in FIG. 4, after the boron dopant region 28 is formed, still another ion implantation may be carried out to implant boron dopant directly under the boron dopant region 28 to form a boron dopant region 30. In this event, the dopant stop layer 26 may be disposed between the boron dopant region 28 and the boron dopant region 30. Part of the dopant stop layer 26 may overlap the boron dopant region 28, part of the dopant stop layer 26 may overlap the boron dopant region 30, or part of the dopant stop layer 26 may overlap both the boron dopant region 28 and the boron dopant region 30 at the same time. The boron dopant region 28 and the boron dopant region 30 are used to adjust the threshold voltage of the gate structure 12.

Figure 5:
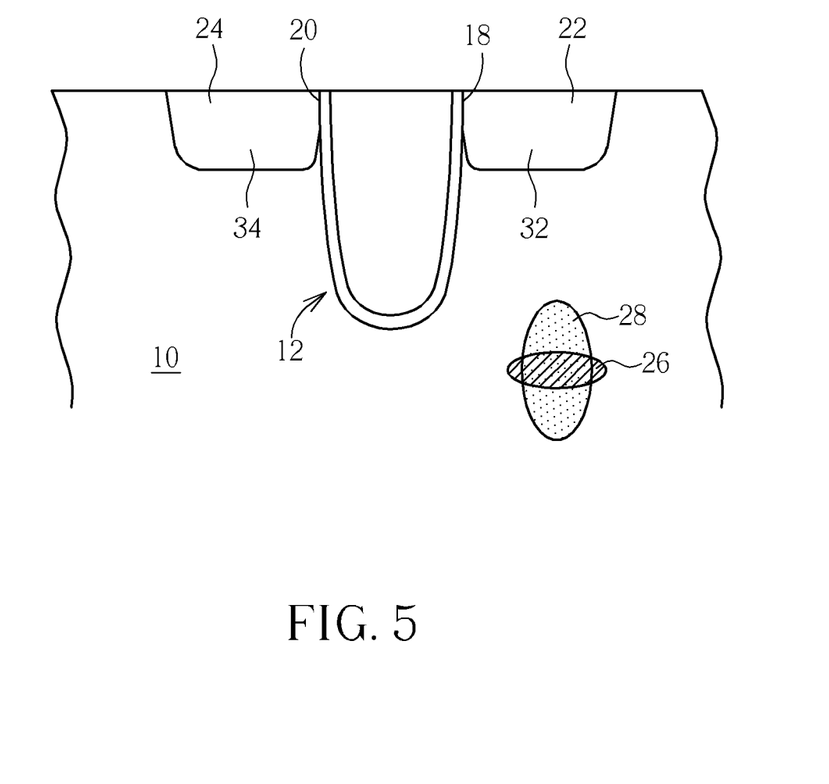
Figure 6:
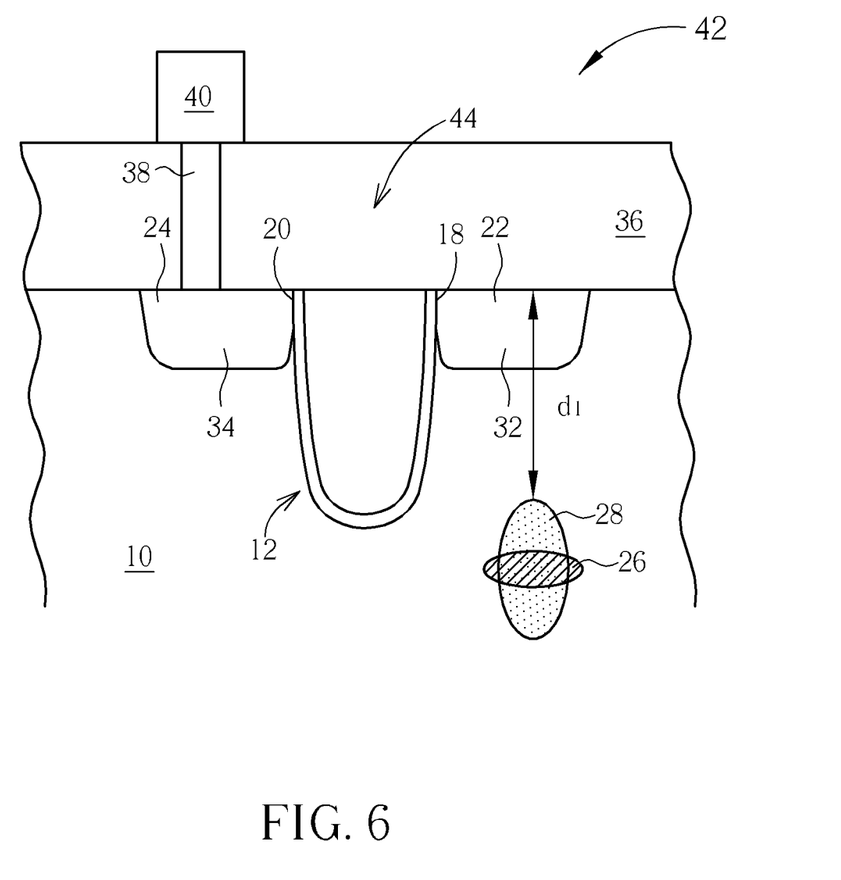

The following steps are carried out after the step illustrated in FIG. 2. As shown in FIG. 5, another ion implantation is carried out to respectively form a source doping region 32 and a drain doping region 34 at the first side 18 of the gate structure 12 and at the second side 20 of the gate structure 12. The source doping region 32 partially overlaps the source lightly doping region 22 and the drain doping region 34 partially overlaps the drain lightly doping region 24. The dopant for the source doping region 32 and the drain doping region 34 is preferably As. Finally, as shown in FIG. 6, a dielectric layer 36 is formed on the substrate 10 and a drain contact plug 38 is formed to electrically connect the drain doping region 34. A capacitor 40 is then formed to electrically connect the drain contact plug 38. At this point, the DRAM 42 with the dopant stop layer of the present invention is completed. Please note that no boron dopant region exists under the drain lightly doping region 24 as opposed to the boron dopant region 28 under the source lightly doping region 22.

FIGS. 6-9 illustrate the DRAM with the dopant stop layer in accordance with several preferred embodiments of the present invention. As shown in FIG. 6, the DRAM 42 with the dopant stop layer of the present invention includes a substrate 10 and a trench-type transistor 44 disposed on the substrate 10. The trench-type transistor 44 includes a gate structure 12 embedded in the substrate 10, a source lightly doping region 22 and a source doping region 32 disposed at a first side 18 of the gate structure 12, a drain lightly doping region 24 and a drain doping region 34 disposed at a second side 20 of the gate structure 12. The DRAM 42 with the dopant stop layer of the present invention includes at least one boron doping region 28 which is disposed in the substrate 10. The boron doping region 28 is disposed directly under the source doping region 32, a dopant stop layer 26 is disposed within the boron doping region 28 and partially overlaps the boron doping region 28, and a capacitor 40 is electrically connected to the drain doping region 34 through a drain contact plug 38. The gate structure 12 may be a trench-type gate structure, a horizontal gate structure, or a fin-type gate structure. In this embodiment, the gate structure 12 is illustrated as a trench-type gate structure.

Please note that, in this embodiment, the dopant stop layer 26 is disposed within the boron doping region 28 and partially overlaps the boron doping region 28. The dopant stop layer 26 includes a dopant which is selected from the group consisting of C, Si, Ge, Sn, Cl, F and Br. Also, the boron region 28 includes boron.

Further, in the DRAM 42 with the dopant stop layer of the present invention, if the distance from the top surface of the substrate 10 of the first side 18 of the gate structure 12 to the boron doping region 18 is set to be a first depth $d_1$, there is no boron doping region from the top surface of the substrate 10 of the second side 20 of the gate structure 12 to the first depth $d_1$.

Figure 7:
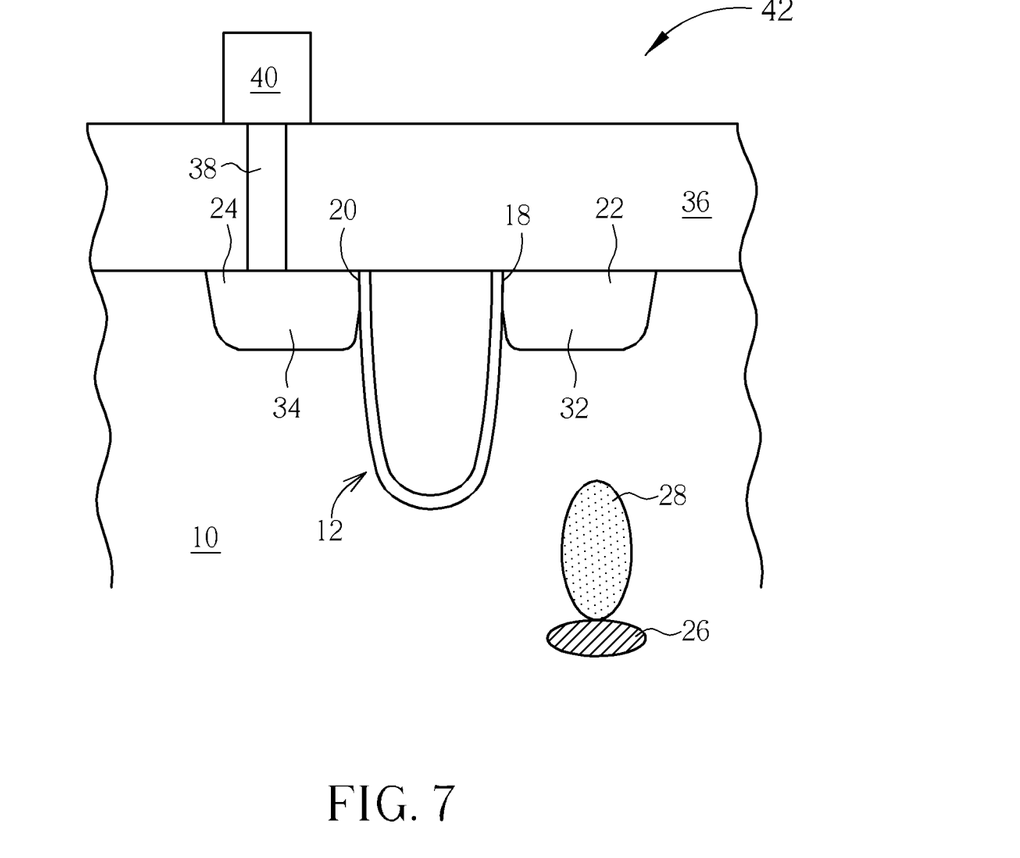
FIG. 7 illustrates the DRAM with the dopant stop layer in accordance with one preferred embodiment of the present invention.

In accordance with another preferred embodiment of the present invention, and as shown in FIG. 7, the dopant stop layer 26 may not necessarily be disposed within the boron doping region 28 and can be disposed under the boron doping region 28. The dopant stop layer 26 may contact the boron doping region 28 or not.

Figure 8:
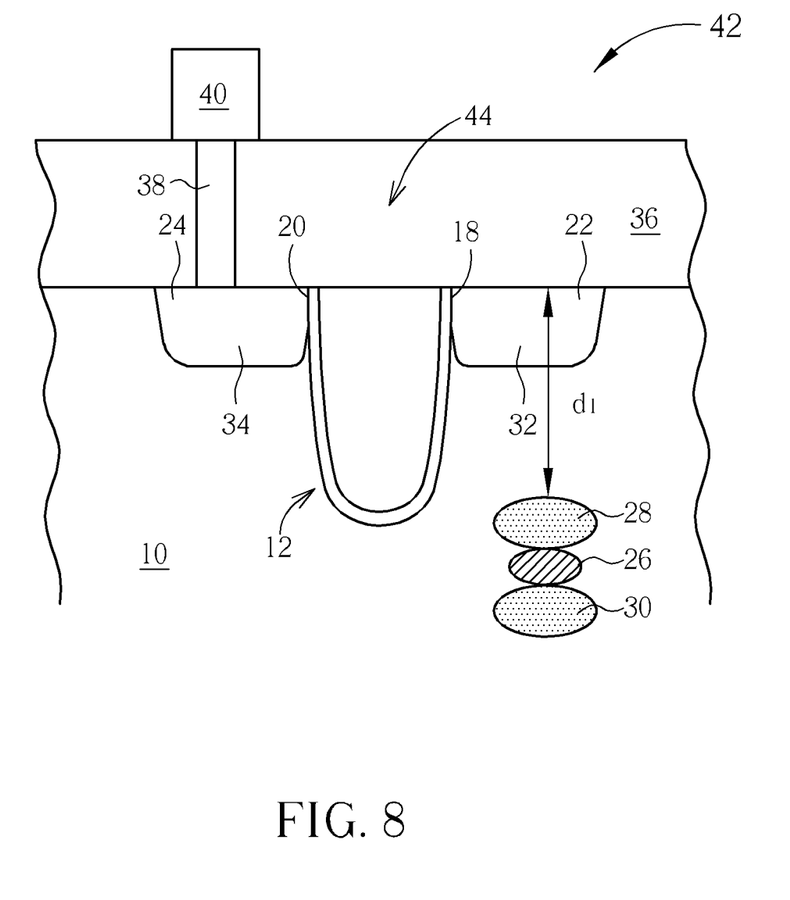
FIG. 8 illustrates the DRAM with the dopant stop layer in accordance with another preferred embodiment of the present invention.

In accordance with another preferred embodiment of the present invention, as shown in FIG. 8, there may be another boron dopant region 30 in the DRAM 42 with the dopant stop layer of the present invention in addition to the boron dopant region 28 so that the dopant stop layer 26 is disposed between the boron dopant region 28 and the boron dopant region 30.

Figure 9:
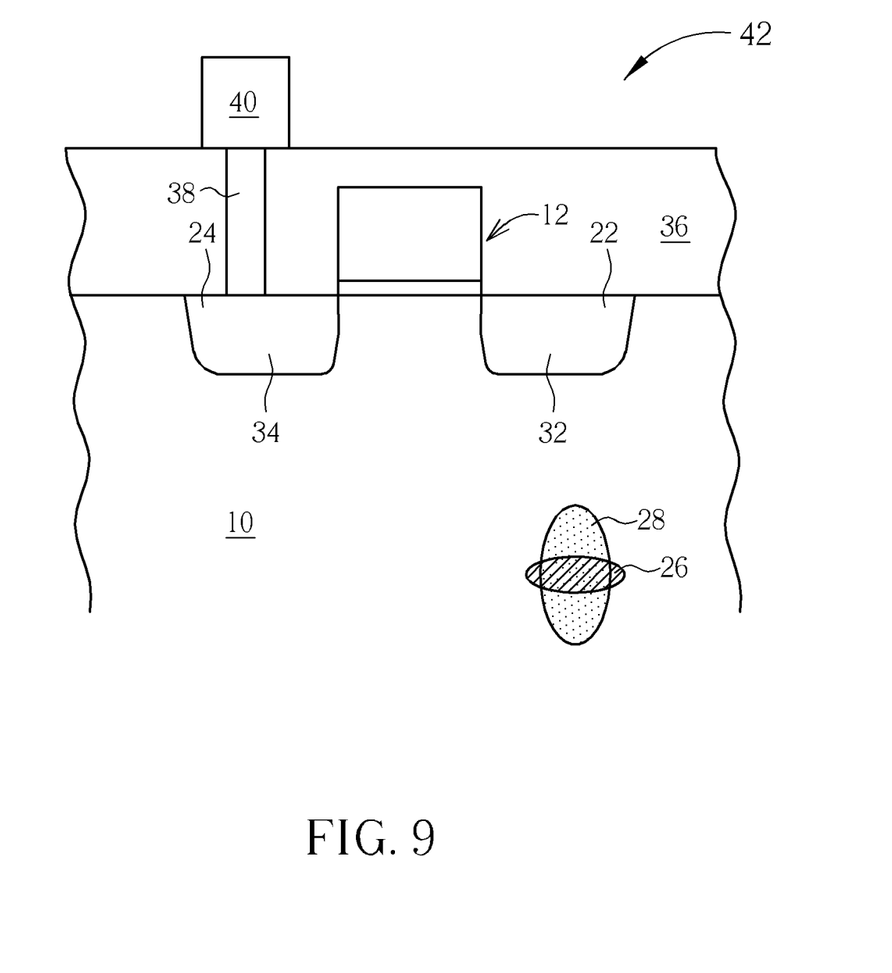
FIG. 9 illustrates the DRAM with the dopant stop layer in accordance with still another preferred embodiment of the present invention.

In accordance with another preferred embodiment of the present invention, and as shown in FIG. 9, the gate structure 12 in the DRAM 42 with the dopant stop layer of the present invention may be a horizontal gate structure. Similarly, the dopant stop layer 26 may be disposed within the boron doping region 28, or under the boron doping region 28. FIG. 9 illustrates the dopant stop layer 26 is disposed within the boron doping region 28.

Generally speaking, the boron dopant region is used to adjust the threshold voltage of the gate structure; however, when the boron dopant in the boron dopant region undergoes a thermal procedure, it is activated, diffuses among the lattices of the substrate and later forms boron clusters after the temperature cools down. The boron clusters lead to a shorter data retention time. The present invention uses the dopant stop layer to block the diffusion of the boron dopant. Since the dopant, such as carbon, in the dopant stop layer has an atomic volume approximately the size of boron, it fills up the gap in the lattice of the substrate after implantation to avoid the diffusion and to further improve the data retention time.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A DRAM with a dopant stop layer, comprising:
   a substrate; and
   a trench-type transistor disposed on said substrate, said trench-type transistor comprising:
   a gate structure embedded in said substrate;
   a source doping region disposed in said substrate and at a first side of said gate structure;
   a drain doping region disposed in said substrate and at a second side of said gate structure;
   a boron doping region disposed in said substrate and under said source doping region;
   a capacitor electrically connected to said drain doping region; and
   a dopant stop layer disposed in said substrate and under said boron doping region, wherein said dopant stop layer comprises a dopant selected from the group consisting of C, Si, Ge, Sn, Cl, F and Br.

2. The DRAM with a dopant stop layer of claim 1, wherein said dopant stop layer is in contact with said boron doping region.

* * * * *